(12) United States Patent
Chakravarti et al.

(10) Patent No.: US 7,838,932 B2
(45) Date of Patent: Nov. 23, 2010

(54) RAISED STI STRUCTURE AND SUPERDAMASCENE TECHNIQUE FOR NMOSFET PERFORMANCE ENHANCEMENT WITH EMBEDDED SILICON CARBON

(75) Inventors: Ashima B. Chakravarti, Hopewell Junction, NY (US); Dureseti Chidambarrao, Weston, CT (US); Judson R. Holt, Wappingers Falls, NY (US); Yaocheng Liu, Elmsford, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 12/028,191

(22) Filed: Feb. 8, 2008

(65) Prior Publication Data

US 2008/0128712 A1 Jun. 5, 2008

Related U.S. Application Data

(62) Division of application No. 11/459,730, filed on Jul. 28, 2006, now Pat. No. 7,473,594.

(51) Int. Cl.
*H01L 29/76257* (2006.01)
(52) U.S. Cl. ...................... 257/341; 257/350
(58) Field of Classification Search ........... 257/300, 257/288, 341, 350
See application file for complete search history.

(56) References Cited

U.S. PATENT DOCUMENTS

| 2005/0035369 | A1 | 2/2005 | Chun-Chieh t al. |
| 2005/0082616 | A1 | 4/2005 | Chen et al. |
| 2005/0093075 | A1 | 5/2005 | Ralf et al. |
| 2006/0134873 | A1 | 6/2006 | Koontz |
| 2006/0199285 | A1* | 9/2006 | Chidambaram et al. ....... 438/14 |
| 2006/0234504 | A1* | 10/2006 | Bauer et al. ................ 438/674 |
| 2007/0018205 | A1* | 1/2007 | Chidambarrao et al. ..... 257/288 |
| 2007/0190741 | A1* | 8/2007 | Lindsay ..................... 438/424 |
| 2008/0006854 | A1* | 1/2008 | Luo et al. ................... 257/288 |

OTHER PUBLICATIONS

Pidin et al., "A novel strain enhanced CMOS archetecture using selectively deposited high tensile and high compressive siliccon nitride films", Electron Devices Meeting, 2004, IEDM Technical Digest, pp. 213-216.

* cited by examiner

*Primary Examiner*—Thao P. Le
(74) *Attorney, Agent, or Firm*—Whitham, Curtis, Christofferson & Cook, P.C.; Joseph P. Abate

(57) ABSTRACT

An embedded silicon carbon (Si:C) having a substitutional carbon content in excess of one percent in order to effectively increase electron mobility by application of tension to a channel region of an NFET is achieved by overfilling a gap or trench formed by transistor gate structures with Si:C and polishing an etching the Si:C to or below a surface of a raised gate structure in a super-Damascene process, leaving Si:C only in selected regions above the transistor source and drain, even though processes capable of depositing Si:C with sufficiently high substitutional carbon content are inherently non-selective.

12 Claims, 6 Drawing Sheets

RAISED STI STRUCTURE AND SUPERDAMASCENE TECHNIQUE FOR NMOSFET PERFORMANCE ENHANCEMENT WITH EMBEDDED SILICON CARBON

CROSS-REFERENCE TO RELATED APPLICATIONS

This application is a division of U.S. patent application Ser. No. 11/459,730, filed Jul. 28, 2006, now U.S. Pat. No. 7,473,594 and which is incorporated herein by reference.

BACKGROUND OF THE INVENTION

1. Field of the Invention

The present invention generally relates to field effect transistor structures and, more particularly, to transistor structures including A stressed channel for carrier mobility enhancement.

2. Description of the Prior Art

At the present time, it is well-recognized that numerous gains in integrated circuit performance, functionality and manufacturing economy may be derived from shrinking the size of semiconductor devices. For example, reduction of size of structure in CMOS devices tends to reduce the channel resistance and increase the switching speed. However, as such devices are scaled to smaller sizes, scattering effects tend to degrade carrier mobility and prevent the full potential switching speed gain due to reduction of resistance from being realized.

CMOS device performance can be improved by development of structures which can apply a persistent tensile or compressive stress to the channel structures of FETs to increase carrier mobility since it has been recognized that compressive stress/strain increases hole mobility while tensile stress/strain increases electron mobility. Masking techniques and suitable materials and deposition techniques have been developed to allow compressive stress to be applied to PFETs and tensile stresses to be applied to NFETs on the same chip.

For example, embedded SiGe structures have been developed which can be placed directly in the source and drain regions to generate compressive stress in the channel and increase hole mobility of PFETs. Similarly, silicon carbon, which has a smaller lattice constant than silicon, can be used to build the embedded silicon carbon (e-Si:C) in NFET source and drain regions to generate tensile stress in the channel for electron mobility enhancement.

However, a substitutional carbon concentration of greater than one atomic percent is necessary to obtain significant improvement in device performance but the equilibrium substitutional solid solubility of carbon in silicon is very low. Low temperature conditions suitable for forming high substitutional carbon concentrations lead to very poor selectivity of deposition which may compromise device manufacturing yield. While some non-selective deposition techniques have been developed to develop high substitutional carbon concentrations, it is difficult to integrate Si:C into devices using non-selective deposition alone.

SUMMARY OF THE INVENTION

It is therefore an object of the present invention to provide a simple and high-yield technique for integrating Si:C into transistors as an embedded structure to enhance electron mobility in NFETs.

It is another object of the present invention to provide a technique for integration of non-selectively deposited materials into transistors of an integrated circuit without compromise of manufacturing yield.

It is a further object of the invention to provide a structure for providing a transistor structure having a channel region having increased levels of tensile stress/strain than previously available.

In order to accomplish these and other objects of the invention, a field effect transistor and an integrated circuit are provided wherein a field effect transistor comprises a gate region, a channel region and source/drain regions adjacent the gate region at ends of the channel region, a raised isolation structure adjacent the source/drain regions and extending into the silicon substrate and protruding from a surface of the silicon substrate, and a body of Si:C material extending across the source/drain regions, a portion of the body of Si:C material being epitaxially grown into and from a trench of the silicon substrate and having a substitutional concentration of carbon above one atomic percent.

In accordance with another aspect of the invention, a method of forming a transistor having enhanced electron mobility is provided including steps of forming a raised isolation structure extending from and into a silicon substrate, forming a gate structure over a channel region, forming source/drain regions adjacent the channel region, epitaxially growing Si:C having a substitutional carbon concentration above one atomic percent between said isolation structure and at least one of said gate structure and said channel region, planarizing the Si:C to the gate structure, and etching the Si:C to or below a surface of the raised isolation structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
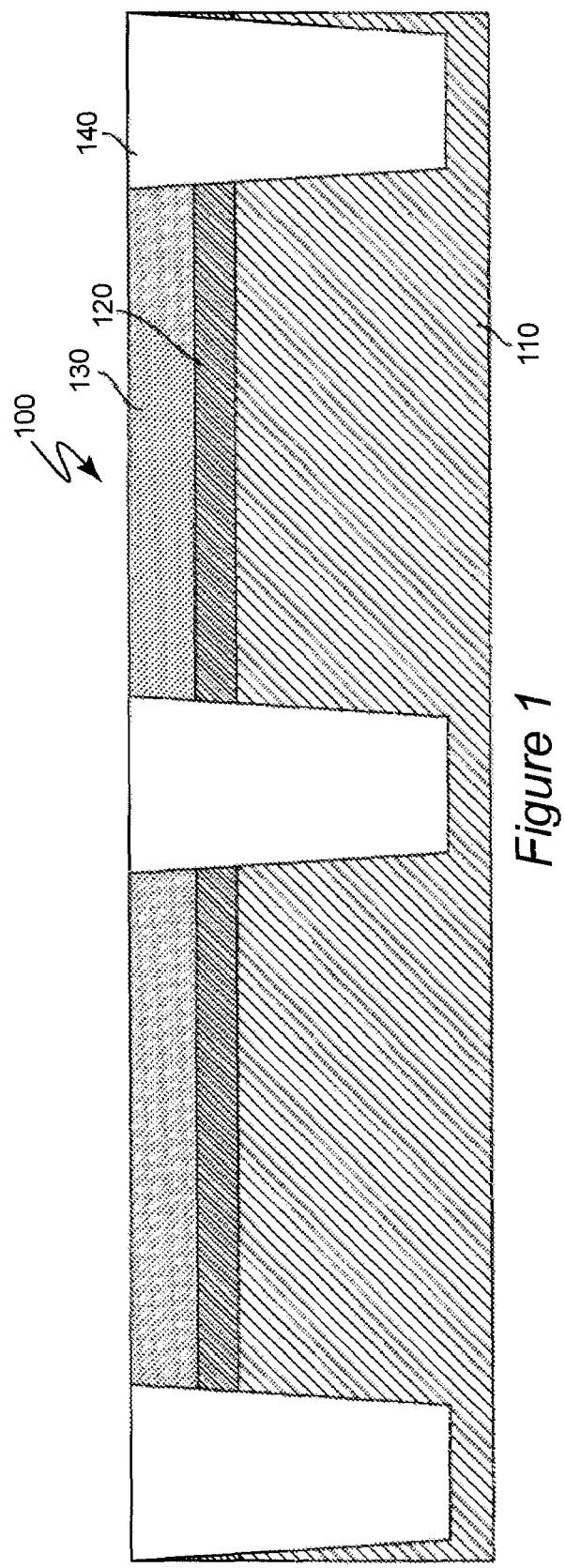
FIG. 1 is a cross-sectional view of an initial stage in production of field effect transistors in accordance with the invention.
Figure 7:
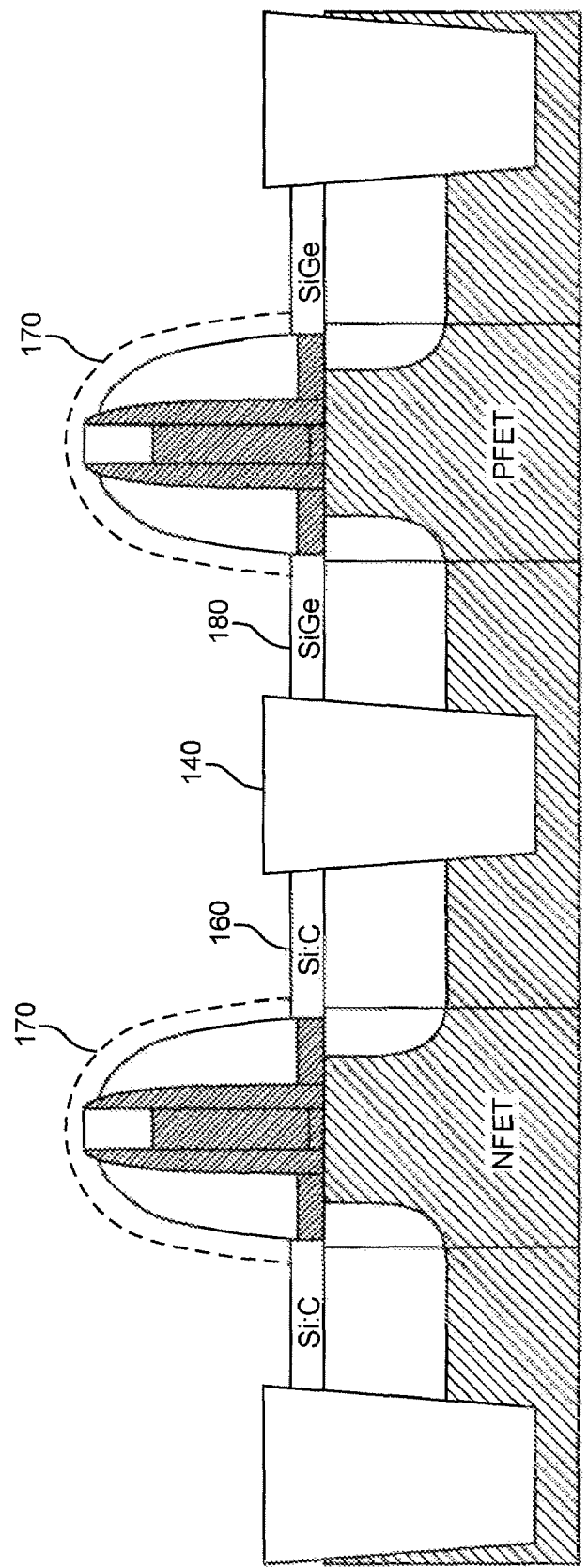
FIG. 7 is a cross-sectional view of an integrated circuit illustrating compatibility of the invention with the formation of embedded SiGe structures in PFET devices.

Referring now to the drawings, and more particularly to FIG. 1, there is shown, in cross-section, an initial stage in formation of transistors with enhanced electron mobility in accordance with the invention by developing tensile stress/strain in the channel region. It should be understood that some embedded structures for producing compressive stress/strain are known using conductive silicon/germanium (SiGe) alloy for increasing hole mobility in PFETs. While the following discussion is directed to formation of NFETs having embedded Si:C, the process which will be described is completely applicable to formation of counterpart or complementary PFETs by simply substituting SiGe materials for Si:C as illustrated in FIG. 7 and several steps which will be described below can be performed in common for both PFETs and NFETs on the same chip or wafer; increasing simplicity and economy of the overall manufacture of integrated circuits including the invention.

To achieve a so-called embedded structure for imposing a tensile or compressive stress on adjacent structures, it is generally necessary to form a trench and fill the trench with stress-inducing material. This requirement also implies that the deposition of the stress inducing material must be selective. However, as pointed out above, it is extremely difficult to obtain epitaxial growth of Si:C having adequate substitutional concentration of carbon and conditions favoring an adequately high substitutional carbon concentration are non-selective. Efforts to increase selectivity of deposition of Si:C having sufficient substitutional carbon concentration by treatments such as etching have been largely unsuccessful. The invention thus seeks to achieve the effects of selective deposition while using a deposition process which is inherently non-selective.

FIG. 1 shows a substrate 110 having a pad oxide layer 120 and a pad nitride layer 130 sequentially deposited or otherwise formed thereon. This layered structure 100 is then masked and the mask patterned at the desired locations for shallow trench isolation (STI) structures. The layered structure is then etched and an insulating material such as oxide, nitride or other insulating materials or combinations thereof in, for example, multi-layered structures is deposited and the structure planarized to form the desired STI structures 140, as shown.

Figure 2:
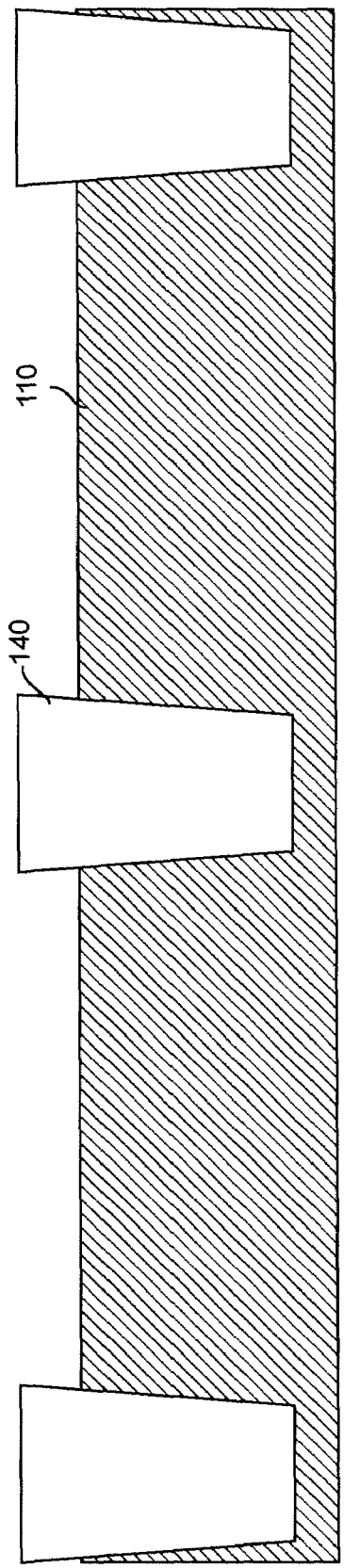
FIGS. 2, 3, 4 and 5 are cross-sectional views of intermediate stages in production of transistors in accordance with the invention.

It is important and desirable to the practice of the invention to provide STI structures which are significantly raised above the substrate for reasons which will be discussed in greater detail below. The total thickness of the pad oxide layer 120 and pad nitride layer 130 should thus correspond to the desired height of the STI structures above the substrate. As is known, nitride and oxide can be etched selectively to each other and the pad oxide thus provides an etch stop for etching the nitride which serves as a polish or etch stop for the planarization process alluded to above. The oxide can then be etched selectively to the substrate (e.g. silicon) and the STI material (or by timed etch if the STI includes exposed oxide or nitride since these layers are or can be made much thinner than the STI dimensions such that the STI is not significantly attacked by the etchant) to result in the structure with raised STI structures illustrated in FIG. 2. It should be noted that this formation of raised STI structures can be performed in common and concurrently for both NFETs and PFETs on the substrate.

Figure 3:
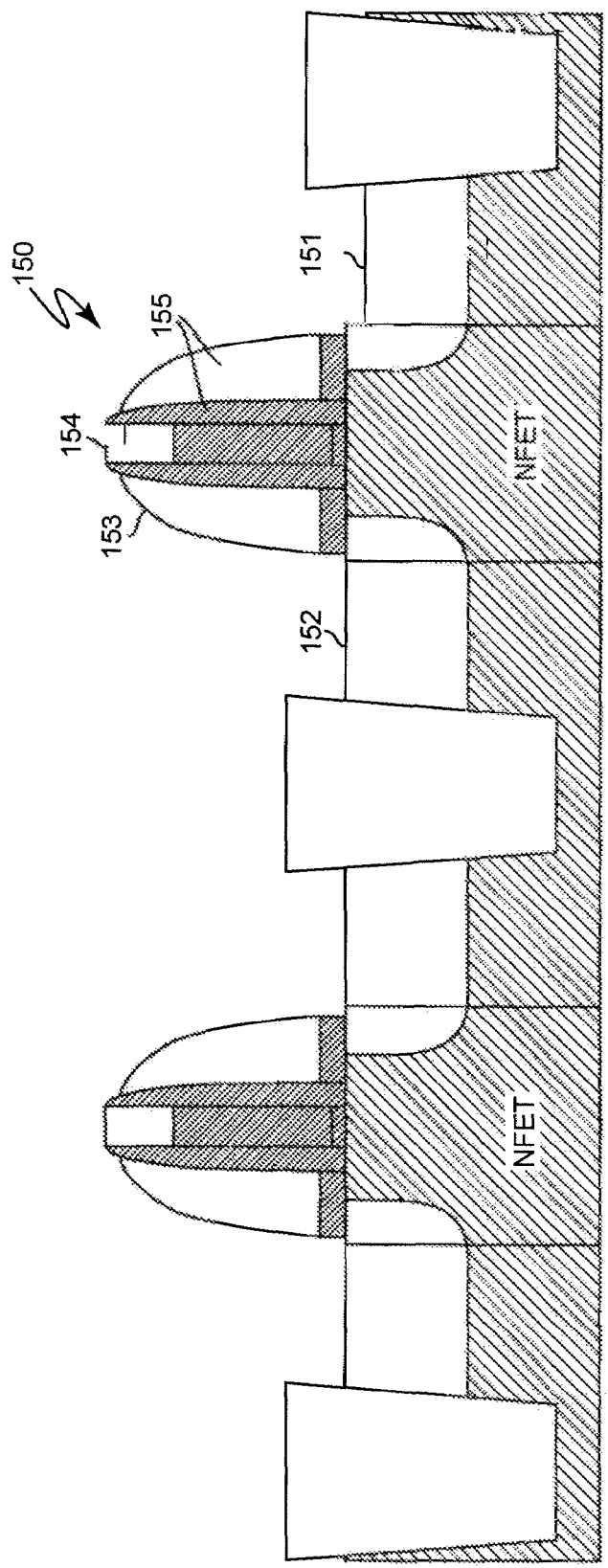

Referring now to FIG. 3, the PFET region is masked and NFET transistors 150, including source 151, drain 152 and gate 153 regions, are formed in accordance with any desired design and by any desired process suitable for the design. At this point or prior thereto, similar PFET structures may be formed. It is preferred but not critical to the practice of the invention to provide a nitride cap 154 for the gates of the transistors 150. Also, in accordance with many current transistor designs, sidewall spacers are preferably included adjacent or part of the transistor gate structure. Then, as shown in FIG. 4, a thick layer 160 of Si:C is non-selectively deposited.

This layer is depicted as being formed as a plurality of randomly sized blocks 160' to represent the non-selective deposition thereof which will, in fact, exhibit a particularly poor morphology during epitaxial growth if only a thin layer of Si:C is deposited, as has been confirmed by scanning electron microscope imaging. Efforts to improve selectivity of Si:C deposition have been largely unsuccessful in achieving crystalline film deposition of Si:C which can develop stresses in adjacent structures.

However, in accordance with the invention, the Si:C is deposited directly on monocrystalline silicon in a very thick layer which overfills the gap (effectively a trench) between the transistor gate stacks. The overfill is then polished back (as in a Damascene process) to the gate stacks and then etched; the collective process being referred to by the inventors as a "super-Damascene" process which results in a structure in a trench or recess as in a Damascene structure or process but which is recessed within the initially overfilled trench (e.g. as defined by the gate stacks) in which the structure is initially deposited to a point at or below the surface of a structure forming a portion of the trench.

Figure 4:
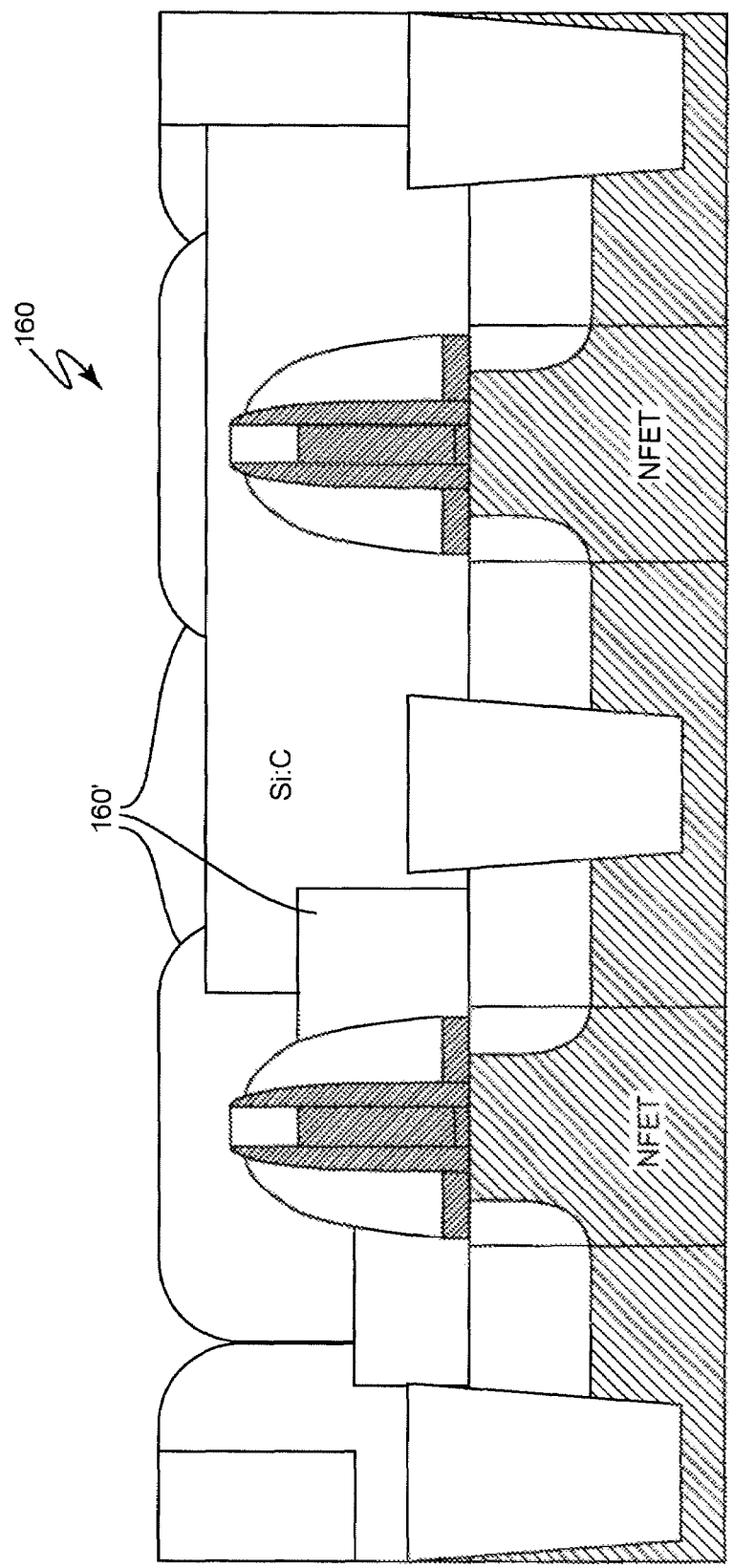

It should be noted that FIG. 4 illustrates the last material deposition process which is specific to the formation of NFETs in accordance with the invention. Therefore, if corresponding materials for developing a compressional force for PFETs (e.g. SiGe) have not already been deposited (e.g. prior to masking incident to the operations of FIGS. 3 and 4, discussed above), the PFET area block out mask can be removed and deposition of the corresponding material may be performed at this point. In either case, at least the planarization and possibly the etching of the PFET and NFET stress/strain-inducing materials, as will be discussed below in connection with FIGS. 5 and 6, may be performed in common for the PFETs and NFETs or sequentially, with or without additional block out masking, depending on the materials and etchants chosen.

Figure 5:
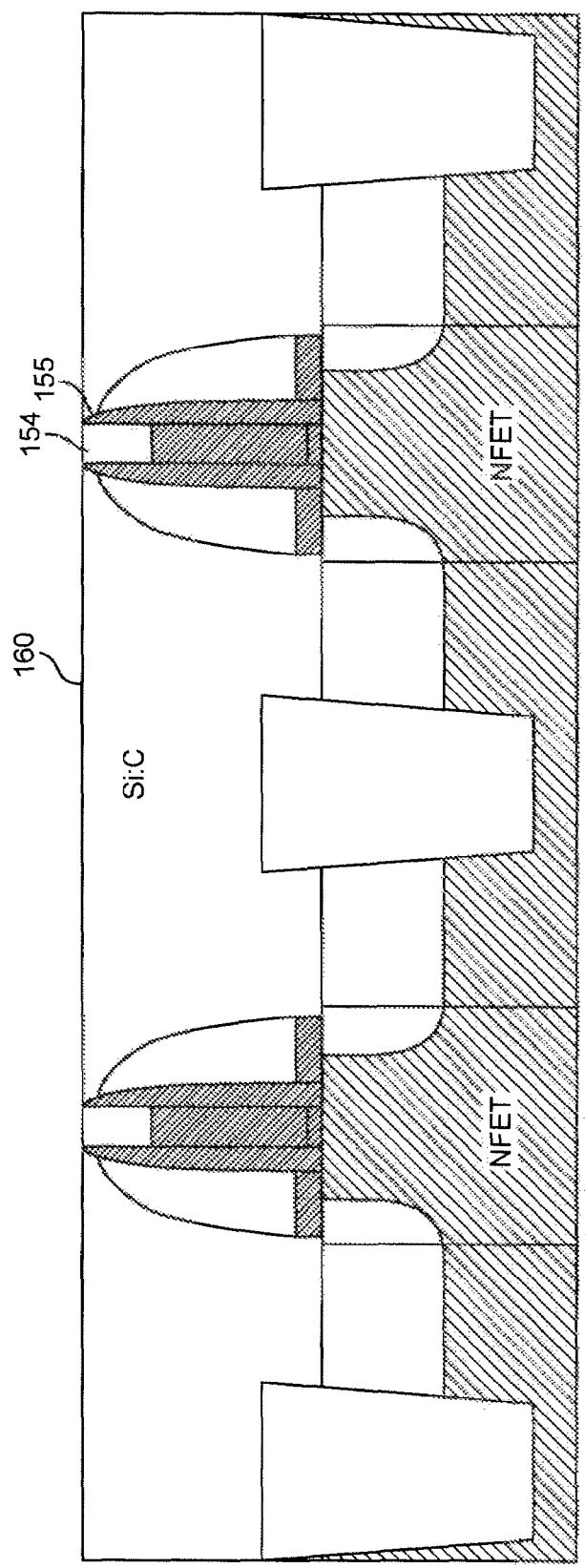

Then, as shown in FIG. 5, the thick Si:C layer may be planarized, preferably to nitride cap 154 which may be used as a polish stop. It should be noted that doing so electrically separates at least the transistor gates to which a contact may be made by removing cap 154 since planarizing to cap 154 also reaches the sidewalls 155 which are of an insulating material. In other words, planarizing to the cap 154 and reaching sidewalls 155 assures that non-selectively deposited Si:C (which is conductive) does not short the gates of respective transistors. By the same token, the planarization makes the remainder of the thick Si:C layer much more uniform in regions/trenches between transistor gates so that further etching may be performed much more uniformly.

Figure 6:
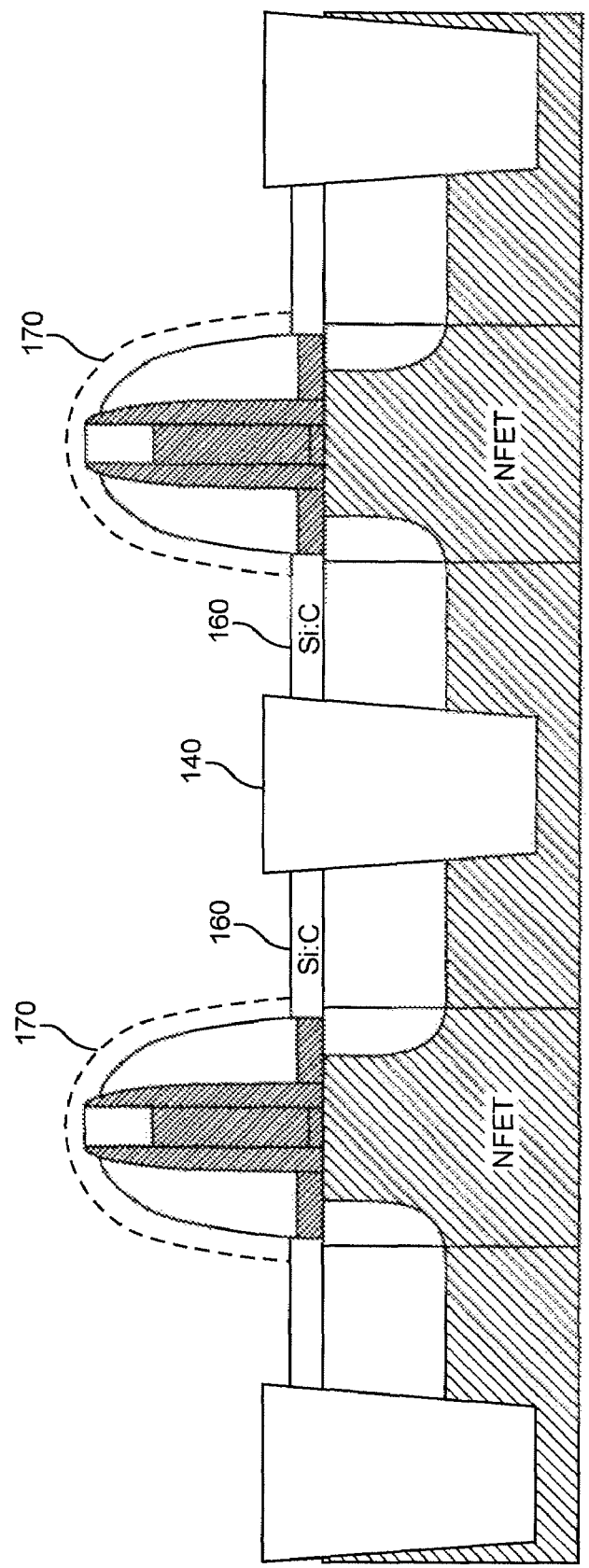
FIG. 6 is a cross-sectional view of substantially completed transistors in accordance with the invention.

Then, as shown in FIG. 6, the Si:C is etched at least to the surface of STI structures 140 which fully separates the transistors not only from each other but also separates the source and drain of each transistor and from neighboring transistors. The etching, in combination with the planarization described above thus achieves the effect of selective deposition although only non-selective deposition is employed. The height of the raised STI structure allows for substantial overetch to assure that no Si:C bridges between transistors or source and gate regions of respective transistors. It should be noted the height of the STI structures may be chosen such that substantial overetching is possible to assure good manufacturing yield while still leaving substantial thickness of Si:C layer 160 to develop substantial stress. The raised STI structure also provides the same benefits and meritorious effects if used in complementary PFETs to form similarly shaped embedded SiGe (e-SiGe) structures.

Further, the Si:C extends over the entire source/drain regions and part or all of the source/drain extension regions and thus can develop the maximal degree of strain possible for a given transistor pitch and lateral STI structure dimension. Moreover, in extending to the transistor sidewall, the Si:C is optimally proximate to the transistor channel for applying tensile stress/strain thereto. More specifically, since the Si:C is epitaxially grown on the silicon substrate (after implantation is performed to form source and drain structures), the smaller lattice constant of the Si:C serves to cause tensile stress in the source and drain regions and the stresses so developed are well-communicated to the transistor channel through the monocrystalline structure of the substrate 110 in which the source and drain regions are formed.

Additionally, it should be appreciated that the so-called embedded structure formed by remaining portion of Si:C 160 does not interfere with the formation of a so-called capping structure (e.g. 170) which is known for applying tensile or compressive force to a transistor channel for enhancement of carrier mobility. That is, so-called capping structures which extend over the gate of an FET have been developed using materials such as nitride and have been effective in achieving substantial increases in carrier mobility. The embedded structure in accordance with the invention provides for increasing the force applied to the channel in addition to the force which can be achieved through use of capping structures. Conversely, a capping structure 170 may be used to adjust or regulate the force applied to the channel from the embedded structure in accordance with the invention and the force may be either increased or decreased as may be desired by choice of tensile or compressive capping material.

It should also be appreciated that the NFETs (and possibly PFETs, if concurrently formed as discussed above) as shown in FIG. 6 are substantially complete but for contact formation which is facilitated in regard to the source and drain by use of conductive Si:C material. The contacts to the source and drain may be formed by any known or foreseeable technique and which may or may not include silicide formation. Further, contact formation is not compromised by the use of non-conductive materials which may be used in the capping structure since the capping structure need not extend over the entirety of the source or drain.

In view of the foregoing, it is seen that the invention provides a simple and economical, high-yield process for developing a tensile embedded structures for enhancing electron mobility in NFETs and using a conductive material to a level greater than is obtainable with known capping type structures, particularly since only Si:C is currently known as a conductive material capable of producing tensile stresses while the substitutional concentration of carbon sufficient to support that property and selective deposition are effectively mutually exclusive. Moreover, the process is fully compatible with the formation of compressive structures for increasing hole mobility in PFETs as well as formation of capping type stress inducing structures which can be used in combination with the embedded structure in accordance with the invention to provide stress levels and electron mobilities not previously attainable.

While the invention has been described in terms of a single preferred embodiment, those skilled in the art will recognize that the invention can be practiced with modification within the spirit and scope of the appended claims.

The invention claimed is:

1. A field effect transistor comprising
   a gate region, a channel region and source/drain regions adjacent said gate region at ends of said channel region, said channel region and said source/drain regions being formed in a silicon substrate,
   a raised isolation structure adjacent said source/drain regions extending into said silicon substrate and protruding from a surface of said silicon substrate, and
   a body of Si:C material extending across said source/drain regions, a portion of said body of Si:C material being epitaxially grown into and from a trench on said silicon substrate and having a substitutional concentration of carbon above one atomic percent.

2. A field effect transistor as recited in claim 1, further including
   a stressed capping structure extending over said gate region to adjust stress applied by said body of Si:C material.

3. A field effect transistor as recited in claim 2, wherein said stressed capping structure includes a tensile layer.

4. A field effect transistor as recited in claim 2, wherein said stressed capping structure includes a compressive layer.

5. A field effect transistor as recited in claim 1, wherein said body of Si:C material is recessed below a surface of said raised shallow trench isolation structure.

6. An integrated circuit comprising
   first and second field effect transistors comprising
   a gate region, a channel region and source/drain regions adjacent said gate region at ends of said channel region, said channel region and said source/drain regions being formed in a silicon substrate, and
   a raised isolation structure adjacent said source/drain regions extending into said silicon substrate and protruding from a surface of said silicon substrate, and
   wherein a first field effect transistor includes a body of Si:C material extending across said source/drain regions, a portion of said body of Si:C material being epitaxially grown into and from a trench on said silicon substrate and having a substitutional concentration of carbon above one atomic percent, and wherein
   a second field effect transistor includes a body of SiGe material extending across said source/drain regions.

7. An integrated circuit as recited in claim 6, further including
   a stressed capping structure extending over said gate region to adjust stress applied by said body of Si:C material.

8. An integrated circuit as recited in claim 7, wherein said stressed capping structure includes a tensile layer.

9. An integrated circuit as recited in claim 7, wherein said stressed capping structure includes a compressive layer.

10. An integrated circuit as recited in claim 6, wherein said body of Si:C material is recessed below a surface of said raised shallow trench isolation structure.

11. A field effect transistor as recited in claim 1 wherein said trench is defined by a raised portion of said raised isolation structure and a gate structure forming said gate region.

12. An integrated circuit as recited in claim 6 wherein said trench is defined by a raised portion of said raised isolation structure and a gate structure forming said gate region.

* * * * *